United States Patent [19]

Ishii

[11] Patent Number: 5,074,736
[45] Date of Patent: Dec. 24, 1991

[54] SEMICONDUCTOR WAFER CARRIER DESIGN

[75] Inventor: Kaoru Ishii, Garland, Tex.

[73] Assignee: Texas Instruments Incorporated, Dallas, Tex.

[21] Appl. No.: 631,180

[22] Filed: Dec. 19, 1990

Related U.S. Application Data

[63] Continuation of Ser. No. 287,173, Dec. 20, 1988, abandoned.

[51] Int. Cl.⁵ ............................................. B65G 1/00
[52] U.S. Cl. .................................... 414/331; 118/500; 198/803.01; 206/454; 414/160
[58] Field of Search ............... 118/500; 204/297 R; 206/449, 454, 455; 198/803.01; 269/287, 296, 900; 414/160, 331

[56] References Cited

U.S. PATENT DOCUMENTS

| | | | |
|---|---|---|---|
| 3,623,712 | 11/1971 | McNeilly et al. | 263/41 |
| 3,809,050 | 5/1974 | Chough et al. | 118/500 X |
| 4,047,496 | 9/1977 | McNeilly et al. | 118/49.1 |
| 4,048,955 | 9/1977 | Anderson | 118/49.5 |
| 4,081,313 | 11/1976 | McNeilly et al. | 156/610 |
| 4,182,265 | 1/1980 | Bracher | 118/500 |
| 4,589,369 | 5/1986 | Mahler | 118/500 |
| 4,634,512 | 1/1987 | Allen et al. | 118/500 X |
| 4,674,625 | 6/1987 | Swapp et al. | 198/803.01 |
| 4,731,255 | 3/1988 | Maeda et al. | 427/54.1 |
| 4,809,641 | 3/1989 | Plissonnier | 118/500 |
| 4,861,222 | 8/1989 | Mirkovich | 414/331 X |

FOREIGN PATENT DOCUMENTS

| | | | |
|---|---|---|---|
| 2322634 | 8/1976 | France | |
| 0101258 | 8/1979 | Japan | 118/500 |
| 0132319 | 6/1987 | Japan | 118/500 |

Primary Examiner—Robert P. Olszewski
Assistant Examiner—James R. Bidwell
Attorney, Agent, or Firm—B. Peter Barndt; James T. Comfort; Melvin Sharp

[57] ABSTRACT

A carrier-susceptor for use in a continuous chemical vapor deposition reactor system serves as a carrier, cover and heat susceptor for a semiconductor wafer being processes through the reactor system.

5 Claims, 5 Drawing Sheets

SEMICONDUCTOR WAFER CARRIER DESIGN

This application is a continuation of application Ser. No. 287,173, filed Dec. 20, 1988, now abandoned.

FIELD OF THE INVENTION

This invention relates to semiconductor wafer carriers and more particularly to carriers for use in continuous chemical vapor deposition reactors.

BACKGROUND OF THE INVENTION

A continuous chemical deposition reactor may be a stand-alone process system with a continuous semiconductor wafer flow. Basic subsystems in such a system may include a wafer handling, a reaction chamber, a gas flow system, a cooling system, and an electrical system.

The wafer handling system may include wafer loaders and unloaders, wafer carriers, and a track for moving a wafer through the reactor chambers.

The reactor chamber subsystem is the site for processing the semiconductor wafer. Each chamber may include a gas supply inlet, a chamber housing, heat lamps and exhaust.

The gas flow subsystem supplies the reactant gases to each chamber, and may include valves, flow controllers and an exhaust system.

The cooling subsystem assists in maintaining the process temperature and reduces the heat radiation to the surrounding components. Both air flow and water flow may be used in the cooling subsystem.

The electrical subsystem provides subsystem control and powers the reactor, and may include power supplies, motors, sensors, valves, and one or more computer/controller.

A basic reactor and process may be as follows. A semiconductor Wafer is loaded onto a carrier which enters one end of the reactor through a port and is moved successively through the various chambers and out the other end of the reactor through another port. The reactor may not be physically closed, but has gas seals at each end and in between each chamber of the reactor. As an example, a reactor may include eight chambers in which the first chamber consists of a nitrogen seal, the second chamber is a preheat chamber, the next four chambers may be deposition chambers, then a cool-down chamber, and the last chamber is a nitrogen seal.

A typical gas supply system may supply gases for two different deposition processes which may be directed into any of the deposition chambers. Each chamber is effectively divided into two portions, a top portion and a bottom portion by the substrate carriers and spacers between each wafer carrier. The unctions between the chambers effectively isolate one chamber from the other by the flow of gases or the exhaust gases from the chambers.

SUMMARY OF THE INVENTION

The invention relates to susceptor or wafer carriers used in multi-chamber continuous chemical vapor deposition reactors. A semiconductor wafer is removed from a wafer cassette by a robotic arm and is placed in a carrier. The carrier may be one of several configurations to accommodate wafers of different diameters. Each carrier, which may be, for example, of graphite or graphite coated with silicon carbide, may hold one or more wafers, depending upon the diameter of the wafer.

The wafer is placed so that it is face down in the reactor such that all processing of the wafer is done from the underside of the carrier.

The carrier is optimized so that it may be used for one eight inch semiconductor wafer or two six inch semiconductor Wafers. In prior systems, different reactors had to be used for different wafer sizes.

In one embodiment of the invention, the wafer is held in place by clips on the under side of the carrier. In another embodiment of the invention, the wafer is placed in two slots or tracks formed on the under side of the carrier. In the two examples mentioned above, the carrier serves as the susceptor or heat transfer media to deliver heat to the wafer during processing.

A semiconductor wafer is placed in a carrier and is moved successively through the various chambers and out the end of the reactor. The semiconductor wafer is placed inverted on the carrier. The carrier is the susceptor for radiant heat from incandescent lamp heaters.

Each chamber has an associated heat lamp, gas inlets and outlets, a track on which the wafer carrier is moved, and seals to prevent the gas from escaping to the environment out side the reactor, and to prevent exhaust gases from entering the process chambers, or reaction gases from entering the topside of the reactor chamber. The carrier is used to block the movement of process gas to the reactor chamber area above the carrier.

Each chamber of the reactor is divided into two regions by the wafer carrier. These two regions are regions above the carrier and below the carrier. The process gas flows through the lower part of the reactor below the carrier and across the exposed semiconductor wafer face.

An inert gas may be directed through the upper region of the reactor to prevent the process gases from entering the upper region and to help provide the gas pressure differential needed to prevent exhaust gasses from entering the process region of the reactor.

The junction between chambers effectively isolates one chamber from the other by the flow process gases or the exhaust of gas or gases from the chambers.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTIONS OF THE DRAWINGS

DESCRIPTION OF A PREFERRED EMBODIMENT OF THE INVENTION

Figure 1:
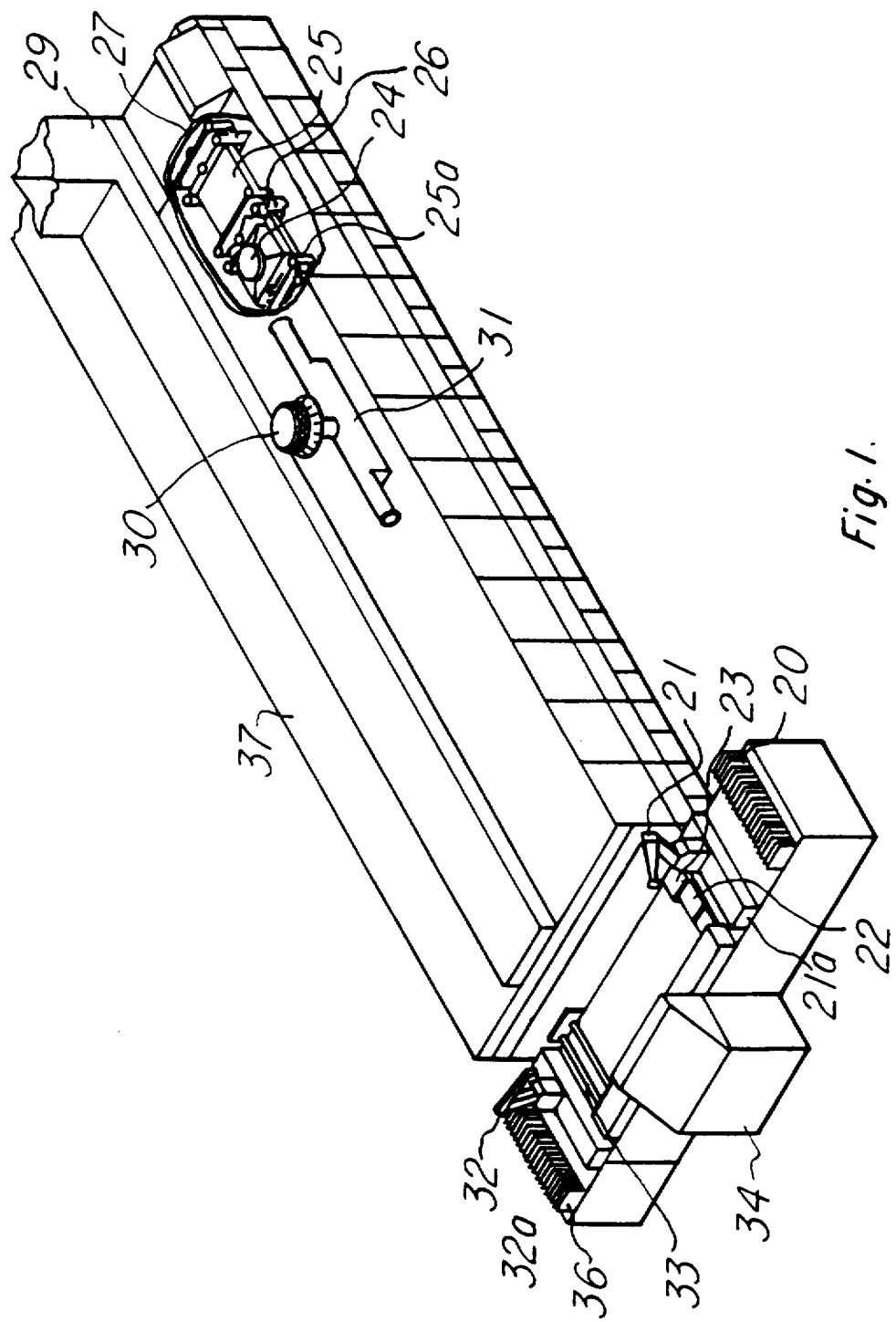
FIG. 1 illustrates a typical CCVD reactor in which the present invention may be used.

FIG. 1 illustrates a typical reactor utilizing the present invention. A plurality of wafer cassettes 20 are located along and adjacent to a robotic arm 21 which moves along a track 21a. The track allows the robotic arm 21 to move adjacent each of a plurality of wafer cassettes so as to permit the robotic arm to access each wafer in each cassette The robotic arm lifts a wafer from a cassette and places it in a carrier 22 at the entrance to the reactor. The entrance 23 to the reactor is a seal joint to prevent gases in the reactor from exiting from the reactor.

At the entrance 23, and before the carrier enters the reactor a vacuum pick-up arm (not illustrated) lifts the lid from the carrier to allow the robotic arm to place a semiconductor wafer into the carrier. After the semiconductor is placed into the carrier the carrier lid is replaced and the carrier is indexed through the reactor and the plurality of chambers that make up the reactor.

The carrier is indexed through the reactor and chambers using the length of the carrier and at least one spacer bar between each carrier. As each carrier is indexed into the reactor, each preceding carrier is moved to the next reactor chamber.

The indexing is continuous, and as the carrier exits from the last reaction chamber it is indexed through the return path of the reactor to the exit opening in the reactor, where the lid of the carrier is removed by the return lid pick-up (not illustrated). Tracks 33, which extend through out the reactor, are used to move the wafer carrier through the reactor. A robotic arm 32 mounted on track 32a removes the semiconductor wafer from the carrier and places it in a wafer cassette 36.

The reactor is divided into a plurality of quartz reactor chambers 25. The reaction chambers 25 are joined by a junction 25a through which is introduced the process gases and from which the used gases are exhausted.

Positioned over each reaction chamber is a heater block 24, used to heat the reaction chamber to a desired temperature. Water to cool the lamp housing is introduced through the junctions 25a though inlet 26.

Each junction 25a has at least one exhaust tube 27 for removing exhaust gases from the reaction chambers. The exhaust gases are directed through a burn-off tube 31 to the gas burner 30.

The entire reactor is shrouded in an enclosure 37, and an air duct 29 is provided to circulate and exhaust gas/air from inside the system shroud.

Figure 2:
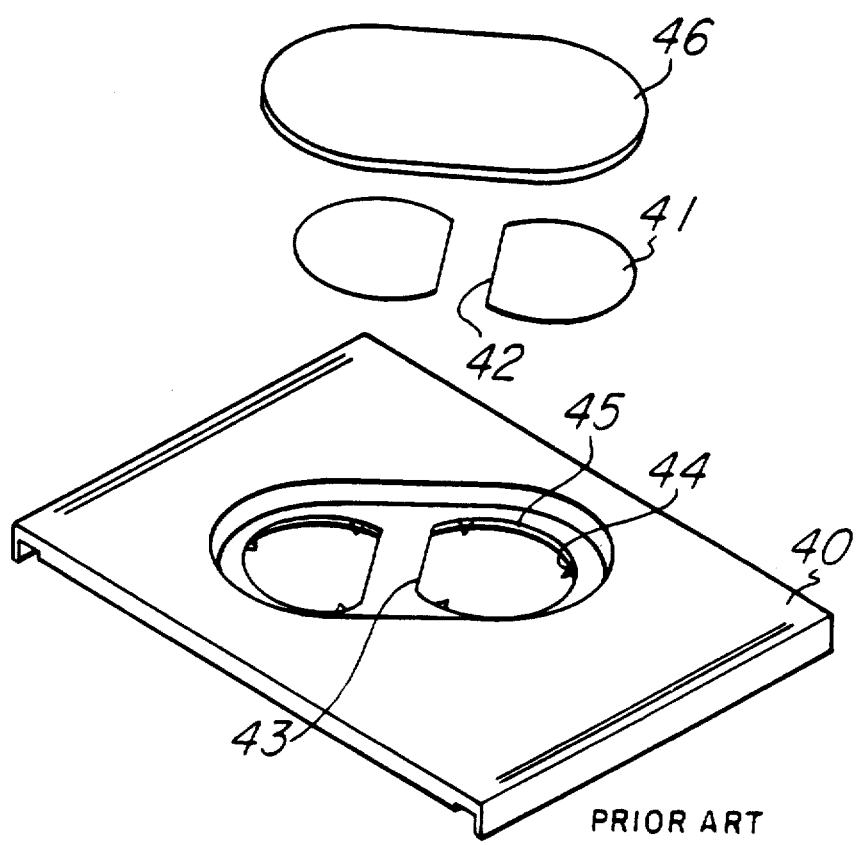
FIG. 2 illustrates a top loading semiconductor carrier of the prior art.

FIG. 2 illustrates a typical prior art semiconductor carrier 40 having an opening 45 therein into which is place a semiconductor wafer 41. The wafer has one flat edge 42 which is used to index or orientate the wafer. Opening 45 also has a flat side 43 to match the flat edge 42 of the semiconductor wafer. It is necessary to orientate the wafer such that the flat of the semiconductor Wafer matches the flat of the carrier wafer opening. Tabs 44 protrude from the bottom of opening 45 to hold the semiconductor in the opening and to expose a maximum of the under side of the wafer, which is the process side of the wafer.

Lid 46 is used to cover the up, or back, side of the wafer during processing, and to distribute heat to the semiconductor wafer during processing.

Figure 3:
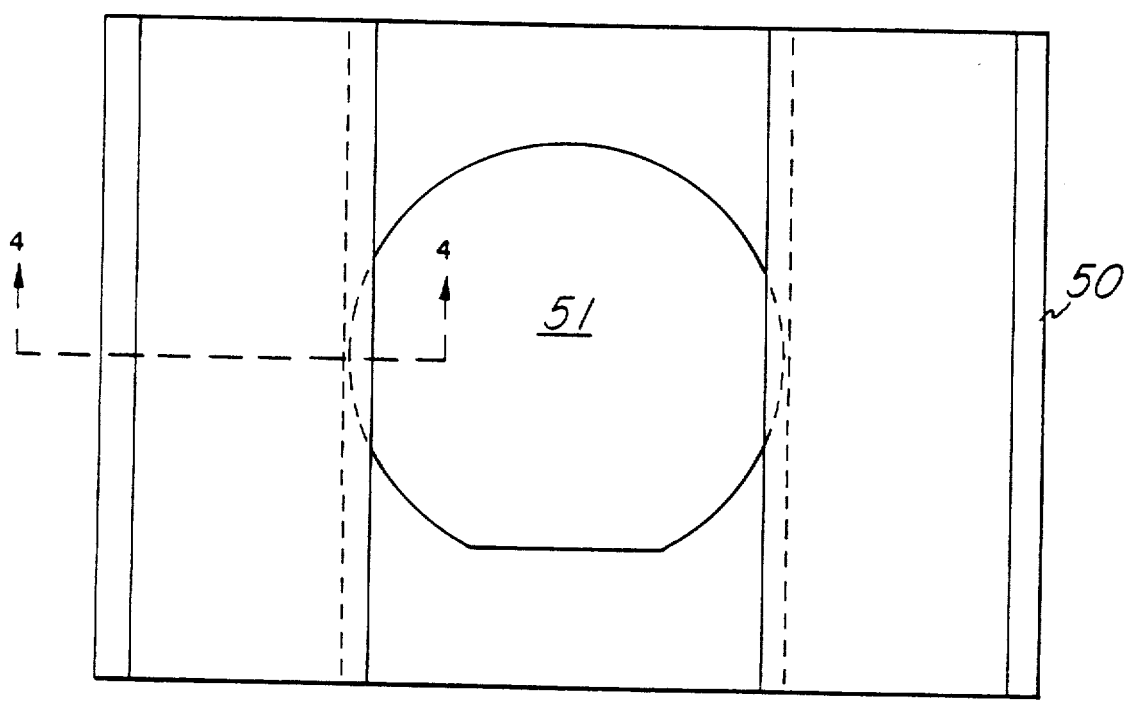
FIG. 3 illustrates a bottom loading semiconductor carrier according to the present invention.
Figure 4:
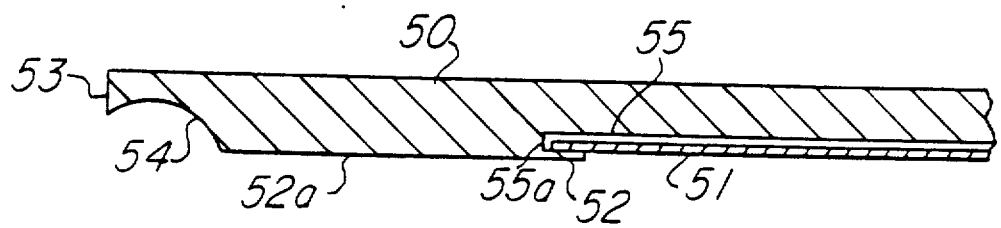
FIG. 4 is a cross section of a part of FIG. 3 showing the mounting lip of the bottom loading semiconductor carrier.

FIG. 3 and 4 illustrates the bottom side of a semiconductor wafer carrier 50 with a wafer 51 mounted in recess 55 formed in the bottom of the carrier. The recess 55 has a lip 52 on each side that extends from the side 55a of recess 55 and forms a ledge on which two sides of the semiconductor are supported holding the semiconductor wafer 50 in recess 55. Semiconductor wafer 50 is inserted or loaded into the carrier from either side 57a, 57b of the carrier and remains there during processing. Orientation of the wafer prior to loading is not required. The carrier serves as the susceptor for the wafer and delivers heat to the wafer.

Two sides of the carrier have ends 53a and 53b over a circular groove 54 which slides along tracks (not illustrated) in the reaction chambers. The groove 54 is in the bottom of the carrier and extends into the ends 53a and 54b.

Figure 5:
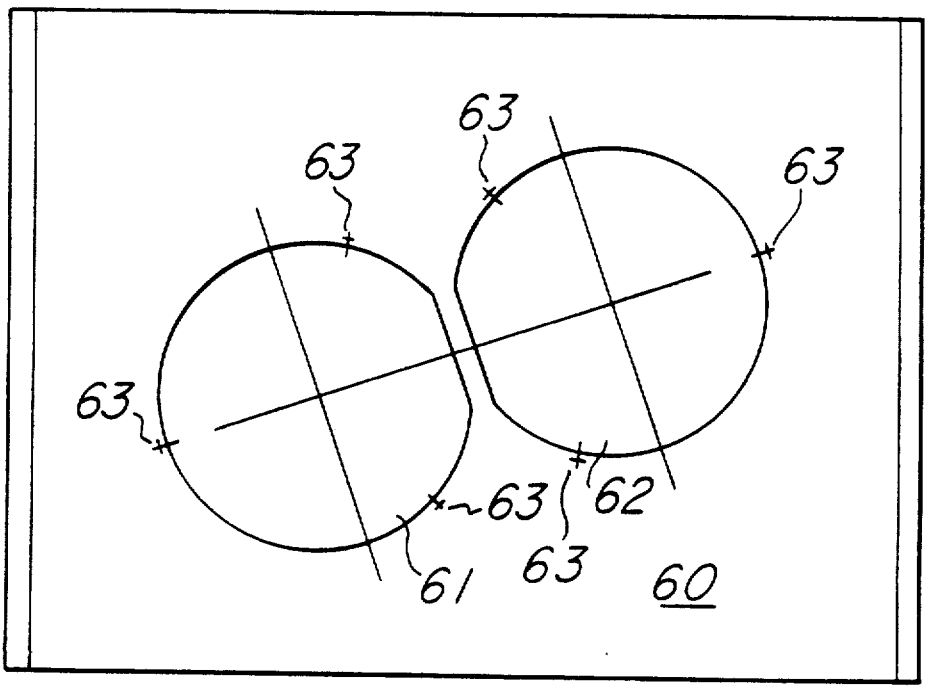
FIG. 5 is another embodiment of a bottom loading semiconductor carrier.
Figure 6:
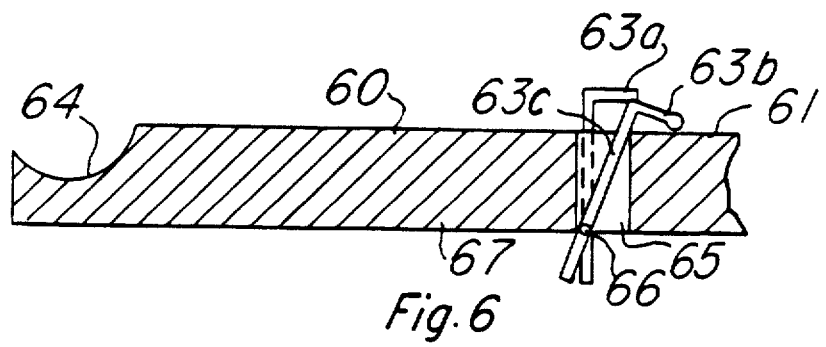
FIG. 6 is a partial cross-sectional view of the carrier of FIG. 5.

FIGS. 5 and 6 illustrate another embodiment of a semiconductor wafer carrier. The carrier illustrated has the capacity to hold two semiconductor wafers on the same carrier. The wafers 61 and 62 are held in place by pins 63 located at three points around the wafer.

Each pin 63 is in the form of an inverted "L" with the vertical leg 63c of the "L" extending though an opening 65 in the carrier. The vertical leg 63c is secured by a pin 66 which serves as a fulcrum or pivot point for leg 63c. When there is no wafer on the carrier, or a wafer is being loaded, pin 63 is in the position indicated in FIG. 6 at 63a. After a wafer is placed on the carrier, the pin 63 is moved against the wafer such that the horizontal portion of pin 63 is against the wafer and holds wafer 61 in place against the carrier.

In FIG. 6, the pin in the holding position is designated 63b. After the wafer is secured to the carrier, the carrier is inverted and placed on tracks which extend though the reactor in which the semiconductor wafer is to be processed. The circular grooves 64, there being one on each side of the carrier, engage the tracks (not illustrated) on which the wafer is transported through the reactor.

Figure 7:
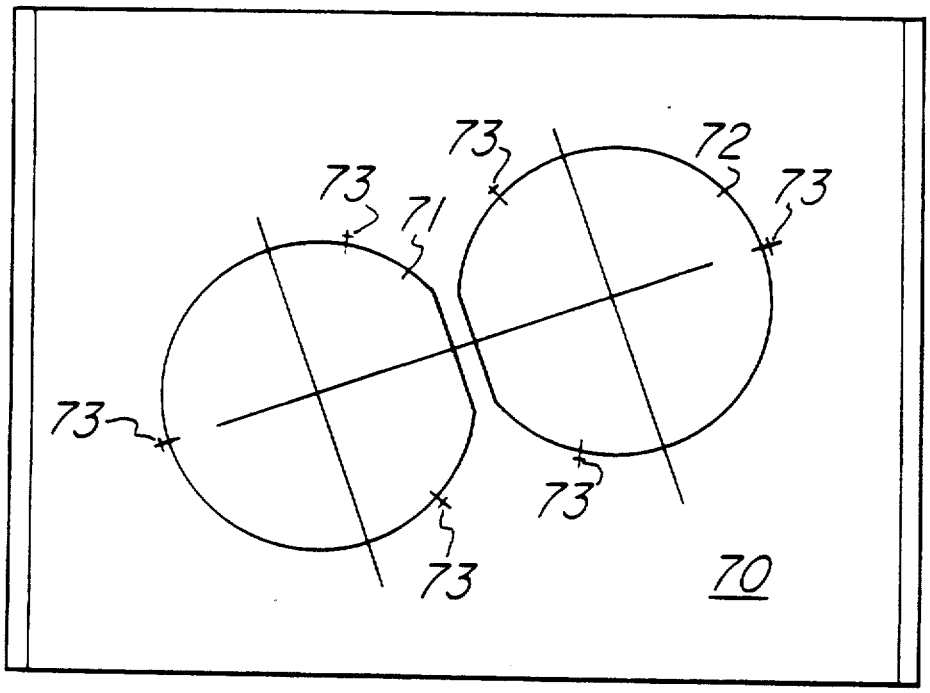
FIG. 7 illustrates another embodiment of a bottom loading semiconductor Wafer carrier.
Figure 8:
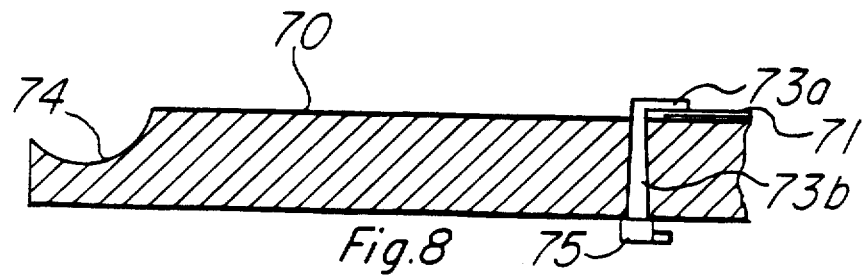
FIG. 8 is a partial cross-sectional view of the carrier of FIG. 7.

FIGS. 7 and 8 illustrate a carrier similar to that illustrated in FIGS. 5 and 6 with different wafer securing pins. Carrier 70 has two wafers 71 and 72 mounted thereon by pins 73. Each pin 73 is in the form of an inverted "L" and extends through the carrier 70. Pin 73 has a vertical part 73b and a horizontal part 73a. The pin rotates such that horizontal part 73a may be turned so that it extends over the semiconductor wafer placed on the surface of the carrier.

There are at least three pins use to secure each semiconductor wafer to the surface of the carrier. After the wafer has been place on the carrier, the pins are rotated such that the horizontal part 73a extends over the wafer. The carrier may then be inverted and transported through the process reactor on tracts on which grooves 74 reside.

In FIGS. 5 and 7 the two semiconductor wafers are shown positioned at an angle and do not extend across the length of the carrier. By placing the wafer at an angle, two, for example, six inch wafers may be place on the carrier, the same sized carrier may be used to hold one eight inch wafer. The design of the carrier permits the processing of either six inch wafers or eight inch wafers in the same reactor system. The diagonal positioning of the wafers also limits the width across the two wafers in the reaction chamber allowing better heat distribution across the wafers.

Through the use of the carrier illustrated in FIGS. 3 to 8, a lid is not required to be used with the carrier since the carrier, when inverted, protects the backside of the wafer from process gases, and the carrier serves as a heat susceptor for the wafer. The requirement for aligning the wafer such that the flat edge mates with a flat in the carrier has been eliminated.

What is claimed is:

1. A semiconductor wafer carrier-susceptor for use in a continuous chemical vapor deposition reactor, comprising a generally rectangular body of a high temperature material having two major faces, first and second ends, and two sides, one major face having a recess formed in and extending across said one major face, two sides of said recess having lips extending out from the sides of the recess forming two tracks in the sides of the recess such that a semiconductor wafer may be placed in the tracks in the recess and held therein when the carrier-susceptor is positioned with the recess and said one major face in a downward position, said carrier-susceptor also having circular grooves, one each groove extending across a respective one of said first and second ends, said grooves formed in said one major face and its respective end,; and wherein the tracks are open at two sides of the carrier-susceptor to allow loading of the semiconductor wafer into either side of the carrier-susceptor.

2. The carrier-susceptor according to claim 1, wherein the carrier-susceptor is made of graphite.

3. The carrier-susceptor according to claim 1, wherein the face of the carrier-susceptor opposite said one major face is used to distribute heat to the semiconductor wafer during processing.

4. The carrier-susceptor according to claim 1, wherein the semiconductor wafer to be mounted on the carrier-susceptor has a flat orientation edge and the mounting of the semiconductor in the carrier-susceptor is independent of the orientation of the semiconductor wafer.

5. The carrier-susceptor according to claim 1, wherein carrier-susceptor serves as carrier, cover and susceptor.

* * * * *